(12) United States Patent
Mori et al.

(10) Patent No.: US 11,876,033 B2
(45) Date of Patent: Jan. 16, 2024

(54) SEMICONDUCTOR DEVICE INCLUDING RESIN CASE HAVING GROOVE AT CORNER THEREOF

(71) Applicant: Mitsubishi Electric Corporation, Tokyo (JP)

(72) Inventors: Takuro Mori, Fukuoka (JP); Masaru Furukawa, Fukuoka (JP); Takamasa Oda, Fukuoka (JP); Seiji Saiki, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 467 days.

(21) Appl. No.: 17/005,594

(22) Filed: Aug. 28, 2020

(65) Prior Publication Data
US 2021/0183736 A1    Jun. 17, 2021

(30) Foreign Application Priority Data
Dec. 16, 2019 (JP) ................................. 2019-226088

(51) Int. Cl.
*H01L 23/40* (2006.01)
(52) U.S. Cl.
CPC .... *H01L 23/4006* (2013.01); *H01L 2023/405* (2013.01)
(58) Field of Classification Search
CPC ..... H01L 23/34–4006; H01L 2023/4037–405; H01L 2924/161–16798; H01L 23/36–3738; H01L 2224/48091
See application file for complete search history.

(56) References Cited

U.S. PATENT DOCUMENTS

| 4,887,149 A | 12/1989 | Romano' | |
|---|---|---|---|
| 2010/0091464 A1* | 4/2010 | Ohnishi | H05K 7/209 29/890.03 |
| 2019/0074238 A1* | 3/2019 | Okada | H01L 23/433 |

FOREIGN PATENT DOCUMENTS

| JP | S63-31144 A | 2/1988 |
|---|---|---|
| JP | H09-45852 A | 2/1997 |

(Continued)

OTHER PUBLICATIONS

An Office Action; "Notice of Reasons for Refusal," mailed by the Japanese Patent Office dated Jan. 24, 2023, which corresponds to Japanese Patent Application No. 2019-226088 and is related to U.S. Appl. No. 17/005,594; with English language translation.

(Continued)

*Primary Examiner* — Laura M Menz
*Assistant Examiner* — Candice Chan
(74) *Attorney, Agent, or Firm* — Studebaker & Brackett PC

(57) ABSTRACT

An object of the present disclosure is to provide a technique capable of relaxing the stress to be applied around the attachment hole of the resin case at the time of fixing the resin case accommodating the semiconductor element to the heat dissipation component with a bolt. A semiconductor device includes a base plate, a heat dissipation component, and a resin case. In a state where the resin case is disposed on the heat dissipation component via the base plate, the resin case is attached to the heat dissipation component with a bolt. The resin case has a recess portion, an attachment hole formed below the recess portion, and at least one groove formed between a wall portion on an inner peripheral side forming the recess portion and the attachment hole. One end of the at least one groove reaches an outer peripheral end of the resin case.

2 Claims, 7 Drawing Sheets

(56) References Cited

FOREIGN PATENT DOCUMENTS

JP        H09-139463 A     5/1997
JP        2019-161129 A    9/2019

OTHER PUBLICATIONS

An Office Action issued by the German Patent and Trade Mark Office dated Oct. 21, 2022, which corresponds to German Patent Application No. 102020128596.5 and is related to U.S. Appl. No. 17/005,594; with English language translation.

An Office Action mailed by China National Intellectual Property Administration dated Oct. 12, 2023, which corresponds to Chinese Patent Application No. 202011458404.7 and is related to U.S. Appl. No. 17/005,594; with English language translation.

* cited by examiner

SEMICONDUCTOR DEVICE INCLUDING RESIN CASE HAVING GROOVE AT CORNER THEREOF

BACKGROUND OF THE INVENTION

Field of the Invention

The present disclosure relates to a semiconductor device including a resin case that accommodates a semiconductor element and a heat dissipation component to which the resin case is fixed.

Description of the Background Art

The resin case accommodating the semiconductor element is fixed to the heat dissipation component such as a heat sink, with the back surface of the base plate being in a contact state with the heat dissipation component, whereby the heat generated in the semiconductor element is efficiently emitted outside through the base plate and the heat dissipation component.

There has been a problem that when excessive stress is applied to the resin case at the time of fastening the bolts to fix the resin case to the heat dissipation component, cracks are formed around the attachment holes of the resin case.

In order to solve such a problem, for example, Japanese Patent Application Laid-Open No. 2019-161129 discloses a configuration in which a protrusion is provided around a through hole (corresponding to an attachment hole) of a screwed pedestal in a resin case. When screwing the resin case to the heat dissipation component, an excessive increase in bending stress is suppressed by screwing the screw member into the heat dissipation component while crushing the protrusion. As a result, cracks are prevented from forming around the attachment holes of the resin case.

SUMMARY

However, in the technique described in Japanese Patent Application Laid-Open No. 2019-161129, stress relaxation is insufficient because the resin case is deformed only by the height of the protrusion. Therefore, stress may concentrate around the attachment hole of the resin case and the resin case may possibly crack.

An object of the present disclosure is to provide a technique capable of relaxing the stress to be applied around the attachment hole of the resin case at the time of fixing the resin case accommodating the semiconductor element to the heat dissipation component with a bolt.

The semiconductor device according to the present disclosure includes a base plate, a heat dissipation component, and a resin case being rectangular in plan view. The heat dissipation component is disposed on the lower surface of the base plate. The resin case is disposed on the upper surface of the base plate and accommodates a semiconductor element. In a state where the resin case is disposed on the heat dissipation component via the base plate, the resin case is attached to the heat dissipation component with a bolt. The resin case has a recess portion, an attachment hole, and at least one groove. The recess portion is formed at a corner and the head of the bolt is placed therein. The attachment hole is formed below the recess portion and into which the shaft portion of the bolt is inserted. The at least one groove is formed between a wall portion on the inner peripheral side forming the recess and the attachment hole. One end of the at least one groove reaches an outer peripheral end of the resin case.

The configuration facilitates the corners of the resin case to bend downward from the at least one groove of the resin case as a starting point at the time of fixing the resin case accommodating the semiconductor element to the heat dissipation component with the bolts, thus the relaxation of the stress to be applied around the attachment holes of the resin case is ensured.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
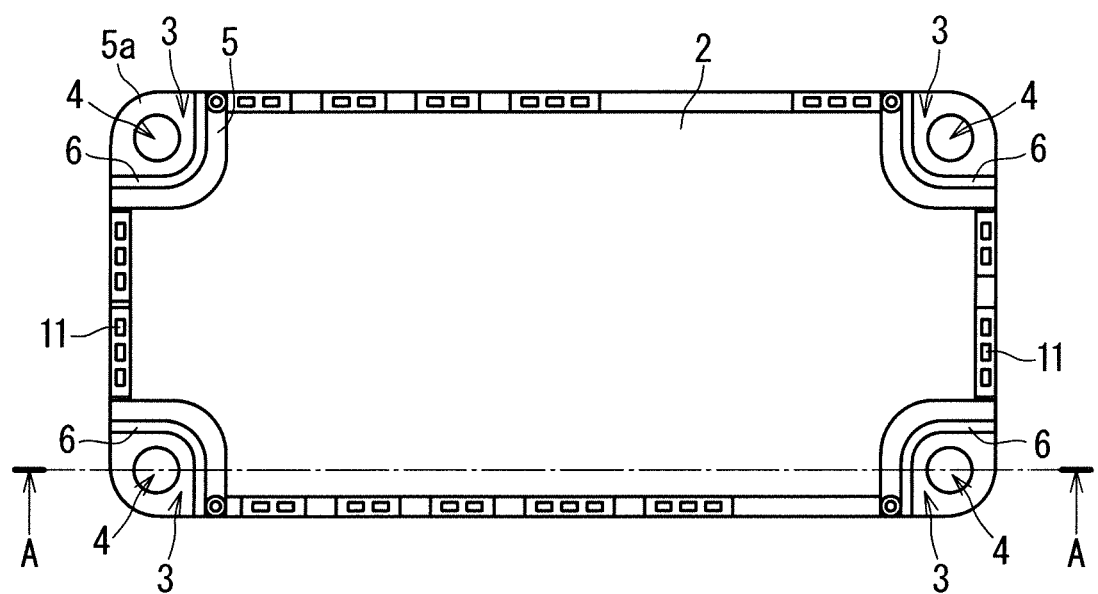
FIG. 1 is a plan view illustrating a state before a resin case and a base plate included in a semiconductor device according to Embodiment 1 are attached to a heat dissipation component.
Figure 2:
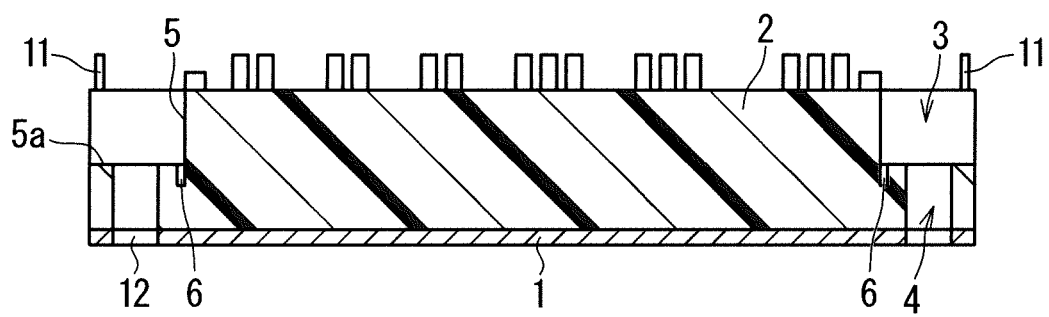
FIG. 2 is a cross-sectional view taken along line A-A of FIG. 1.
Figure 3:
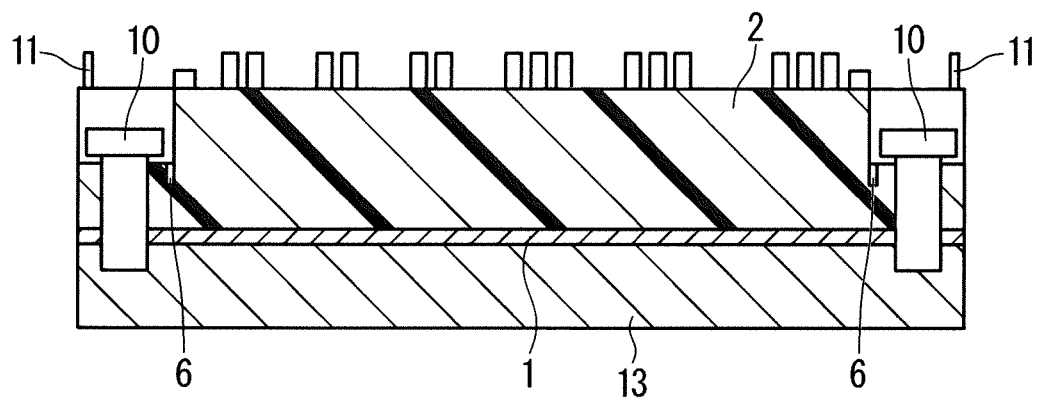
FIG. 3 is a cross-sectional view illustrating the semiconductor device according to Embodiment 1.

Embodiment 1 will be described with reference to the drawings. FIG. 1 is a plan view illustrating a state before a resin case 2 and a base plate 1 included in a semiconductor device 100 according to Embodiment 1 are attached to a heat dissipation component 13. FIG. 2 is a cross-sectional view taken along line A-A of FIG. 1. FIG. 3 is a cross-sectional view illustrating the semiconductor device 100.

As illustrated in FIGS. 1 to 3, the semiconductor device 100 includes the base plate 1, the resin case 2, and the heat dissipation component 13.

The base plate 1 is a rectangular metal plate in plan view. The heat dissipation component 13 is a metal heat sink disposed on the lower surface of the base plate 1. The heat dissipation component 13 has a rectangular shape in plan view and is formed into a thick plate shape.

The resin case 2 is disposed on the upper surface of the base plate 1 and accommodates a semiconductor element. Specifically, an insulating substrate having a circuit pattern is disposed on the upper surface of the base plate 1, the semiconductor element is mounted on the upper surface of the circuit pattern, and these mounted components are sealed with a sealing material such as epoxy resin to form the resin case 2 having a rectangular shape in plan view. Between the semiconductor element and the circuit pattern, and between the circuit pattern and terminal electrodes 11 provided on the upper surface of the resin case 2 are connected with wires.

In a state where the resin case 2 is disposed on the heat dissipation component 13 via the base plate 1, the resin case 2 is attached to the heat dissipation component 13 with bolts 10.

Next, details of the resin case 2 will be described. As illustrated in FIGS. 1 to 3, the resin case 2 has recess portions 3, attachment holes 4, and grooves 6. The recess portions 3 are formed at four corners of the resin case 2, and the heads of the bolts 10 are placed in the recess portions 3. Specifically, the recessed portions 3 are formed by hollowing the four corners of the resin case 2 and each portion has a shape defined by a wall portion 5 in the inner peripheral side and a bottom portion 5a continuous with the lower end of the wall portion 5. Here, the wall portion 5 has an arc shape in plan view.

The attachment hole 4 is formed below the central portion of the recess portion 3 so as to communicate with the recess portion 3, and the shaft portion of the bolt 10 is inserted therein. In Embodiment 1, the contours of the base plate 1, the resin case 2, and the heat dissipation component 13 are the same in plan view; therefore, holes 12 communicating with the attachment holes 4 are formed at the four corners of the base plate 1, and holes (not illustrated) communicating with the holes 12 are formed at the four corners of the heat dissipation component 13. Accordingly, the resin case 2 is attached to the heat dissipation component 13 with the bolts 10 via the base plate 1.

The groove 6 is formed on the upper surface side of the resin case 2, that is, in the portion between the wall portion 5 and the attachment hole 4. Specifically, the groove 6 is formed in an arc shape in plan view along the wall portion 5 on the bottom portion 5a, and both ends of the groove 6 reach the outer peripheral end of the resin case 2. The groove 6 is a round groove or a square groove that is recessed from the upper surface side to the lower surface side of the resin case 2. Accordingly, the broadening of the grooves 6 facilitates the corners of the resin case 2 to bend downward from the grooves 6 as a starting point at the time of fixing the resin case 2 to the heat dissipation component 13 with the bolts 10, and the stress to be applied around the attachment holes 4 is relaxed. Further, according to the action of the bending moment, the stress is reduced by shortening the distance between the fastening point of the bolt 10 which is the power point and the groove 6 which is the fulcrum.

Although the description was made that both ends of the groove 6 reach the outer peripheral portion of the resin case 2, the groove 6 is broadened also at the time of fixing the resin case 2 to the heat dissipation component 13 with the bolts 10 with at least one end of the groove 6 reaching the outer peripheral portion of the resin case 2, and this facilitates the corner of the resin case 2 to bend downward from the groove 6 as a starting point.

Further, the groove 6 may be formed on the lower surface side of the resin case 2, that is, in the portion between the wall portion 5 and the attachment hole 4 on the lower surface of the resin case 2, from the lower surface side of the resin case 2 toward the upper surface side. Accordingly, the narrowing of the grooves 6 facilitates the corners of the resin case 2 to bend downward from the grooves 6 as a starting point at the time of fixing the resin case 2 to the heat dissipation component 13 with the bolts 10, and the stress to be applied around the attachment holes 4 is relaxed. Also, the groove 6 may be formed on the upper surface side and the lower surface side of the resin case 2.

Figure 4:
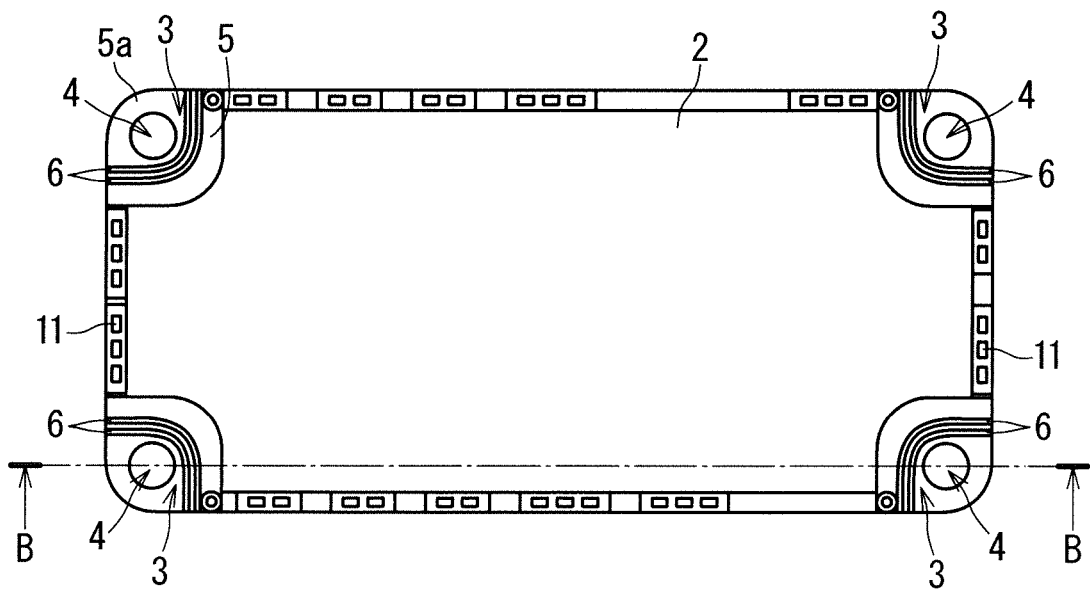
FIG. 4 is a plan view illustrating a state before a resin case and a base plate included in a semiconductor device according to. Modification of Embodiment 1 are attached to a heat dissipation component.
Figure 5:
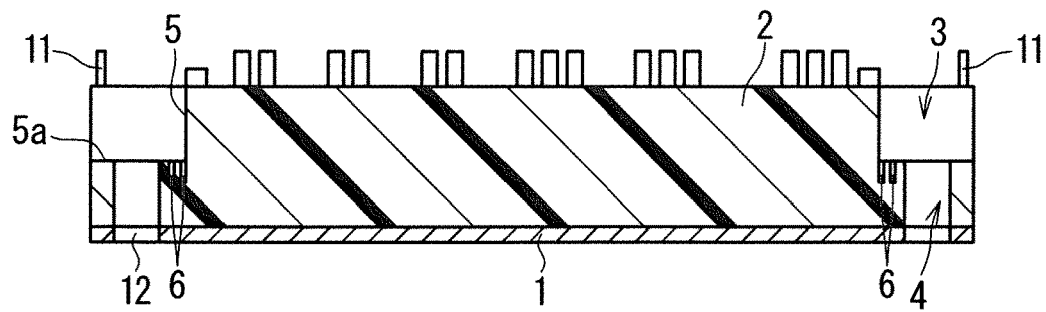
FIG. 5 is a cross-sectional view taken along line B-B of FIG. 4.

Further, as illustrated in FIGS. 4 and 5, two grooves 6 may be formed on the upper surface side in each of four corners of the resin case 2. Also, two grooves 6 may be formed on the lower surface side in each of four corners of the resin case 2, or may be formed on the upper surface side and the lower surface side in each of four corners of the resin case 2. As a result, the corners of the resin case 2 are more facilitated to bend compare with a case where one groove 6 is formed in each corner of the resin case 2. FIG. 4 is a plan view illustrating a state before the resin case 2 and the base plate 1 included in a semiconductor device according to Modification of Embodiment 1 are attached to a heat dissipation component 13. FIG. 5 is a cross-sectional view taken along line B-B of FIG. 4.

As described above, the semiconductor device 100 according to Embodiment 1 includes the base plate 1, the heat dissipation component 13 disposed on the lower surface of the base plate 1, and the resin case 2 having a rectangular shape in plan view disposed on the upper surface of the base plate 2 and accommodating the semiconductor element, in which in a state where the resin case 2 is disposed on the heat dissipation component 13 via the base plate 1, the resin case 2 is attached to the heat dissipation component 13 with the bolts 10, the resin case 2 includes the recess portion 3 in which the head of the bolt 10 is placed, the attachment hole 4 formed below the recess portion 3 and into which the shaft portion of the bolt 10 is inserted, and at least one groove 6 formed between the wall portion 5 on the inner peripheral side forming the recess portion 3 and the attachment hole 4, and one end of the groove 6 reaches the outer peripheral end of the resin case 2.

Therefore, the corners of the resin case 2 are facilitated to bend downward from the grooves 6 of the resin case 2 as a starting point at the time of fixing the resin case 2 accommodating the semiconductor element to the heat dissipation component 13 with the bolts 10, thus the relaxation of the stress to be applied around the attachment holes of the resin case 2 is ensured.

As illustrated in FIGS. 4 and 5, the semiconductor device includes two grooves 6 formed on at least one surface side of the resin case 2; therefore, the corner of the case 2 is further facilitated to bend compared with the case where one groove 6 is formed. As a result, the stress to be applied around the attachment holes 4 of the resin case 2 is further relaxed.

Embodiment 2

Figure 6:
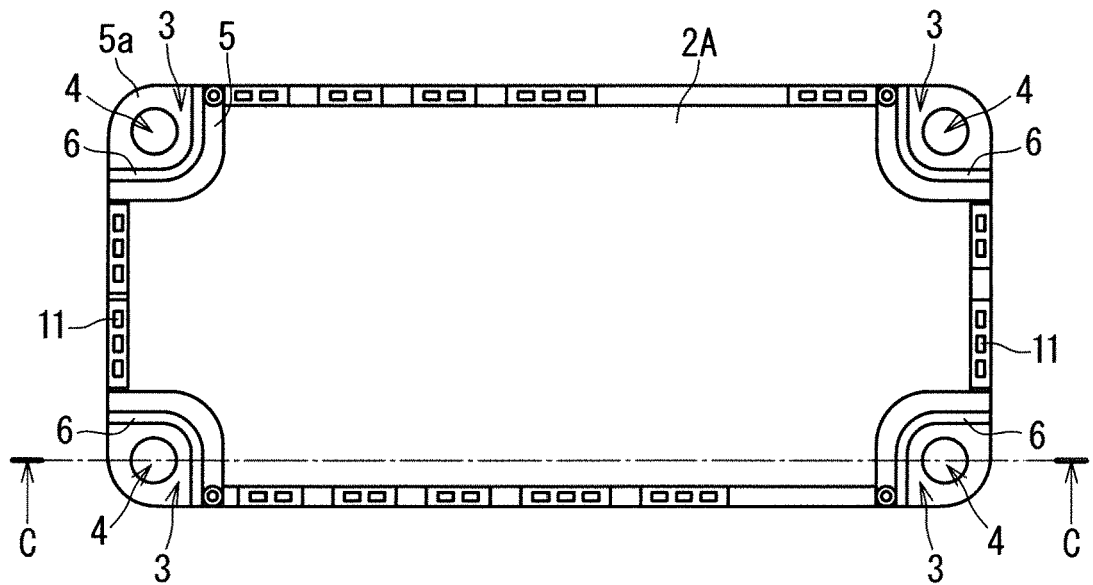
FIG. 6 is a plan view illustrating a state before a resin case and a base plate included in a semiconductor device according to Embodiment 2 are attached to a heat dissipation component.
Figure 7:
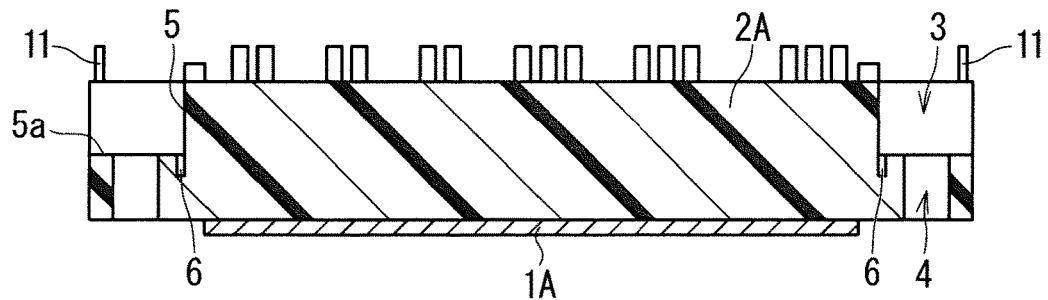
FIG. 7 is a cross-sectional view taken along line C-C of FIG. 6.
Figure 8:
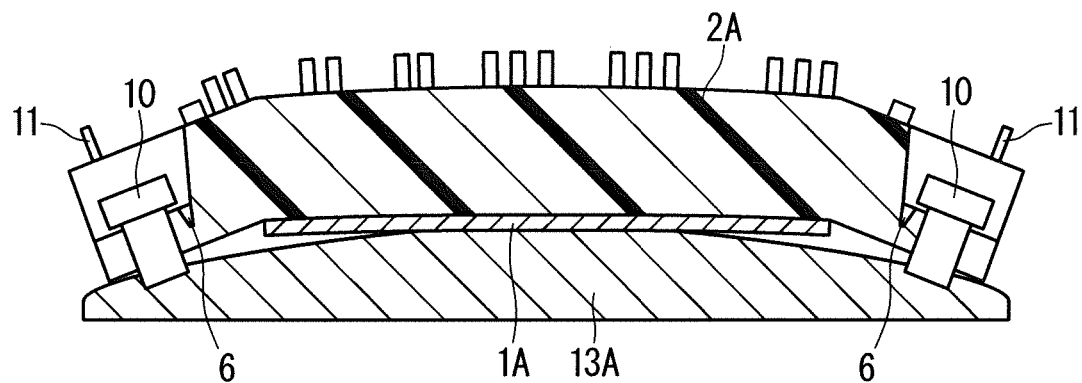
FIG. 8 is a cross-sectional view illustrating the semiconductor device according to Embodiment 2.
Figure 9A:
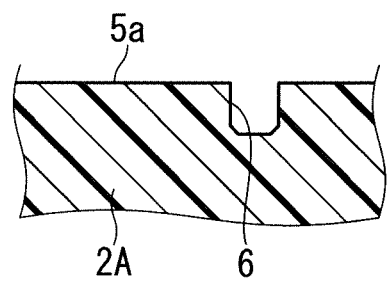
FIGS. 9A and 9B are enlarged cross-sectional views around a groove before and after bolt fastening.
Figure 9B:
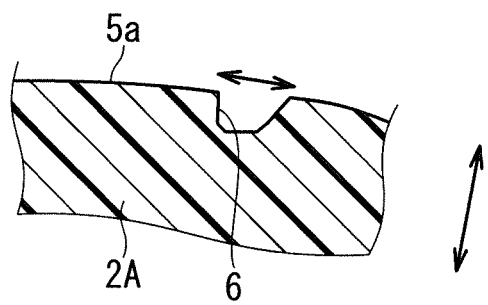

Next, a semiconductor device 100A according to Embodiment 2 will be described. FIG. 6 is a plan view illustrating a state before a resin case 2A and a base plate 1A included in the semiconductor device 100A according to Embodiment 2 are attached to a heat dissipation component 13A. FIG. 7 is a cross-sectional view taken along line C-C of FIG. 6. FIG. 8 is a cross-sectional view illustrating the semiconductor device 100A. FIG. 9A is an enlarged cross-sectional view around a groove 6 before a bolt 10 is fastened. FIG. 9B is an enlarged cross-sectional view around the groove 6 after the bolt 10 is fastened. It should be noted that, in Embodiment 2, the same components as those described in Embodiment 1 are denoted by the same reference numerals, and the description thereof is omitted.

As illustrated in FIGS. 6 to 8, in Embodiment 2, the heat dissipation component 13A has a shape in which the upper surface thereof is bulging in an arc shape, and the resin case 2A is fixed to the heat dissipation component 13A of which upper surface is an arc shape.

The contour of the base plate 1A in plan view is formed smaller than the contour of the resin case 2A in plan view, and the corners of the resin case 2A project from the base plate 1A toward the outer peripheral side. Therefore, the corners of the resin case 2A are directly fixed to the heat dissipation component 13A without interposing the base plate 1A.

As illustrated in FIG. 9A, the groove 6 is a round groove that is recessed from the upper surface side to the lower surface side of the resin case 2A. As illustrated in FIGS. 8 and 9B, the groove 6 broadens and the corner of the resin case 2A is allowed to bend downward from the groove 6 as a starting point at the time of fixing the resin case 2A to heat dissipation component 13A with the bolts 10; therefore, fixing the resin case 2A along the shape of the upper surface of the heat dissipation component 13A is ensured.

As described above, in the semiconductor device 100A according to Embodiment 2, the heat dissipation component 13A has a shape in which the upper surface thereof is bulging in an arc shape, the groove 6 is a round groove that is recessed from the upper surface side to the lower surface side of the resin case 2A, the corners of the resin case 2A project from the base plate 1A toward the outer peripheral side, and, in a state where the grooves 6 are broadened, the corners of the resin case 2A are bent downward.

Accordingly, the base plate 1A is not disposed on the back side of the corners of the resin case 2A; therefore, the corners of the resin case 2A is facilitated to bend downward at the time of fixing the resin case 2A to the heat dissipation component 13A with the bolts 10; therefore, the stress to be applied around the attachment holes 4 of the resin case 2A can be further relaxed. At this point, the groove 6 broadens and the corner of the resin case 2A is allowed to bend downward, and fixing the resin case 2A along the shape of the upper surface of the heat dissipation component 13A is ensured.

Embodiment 3

Figure 10:
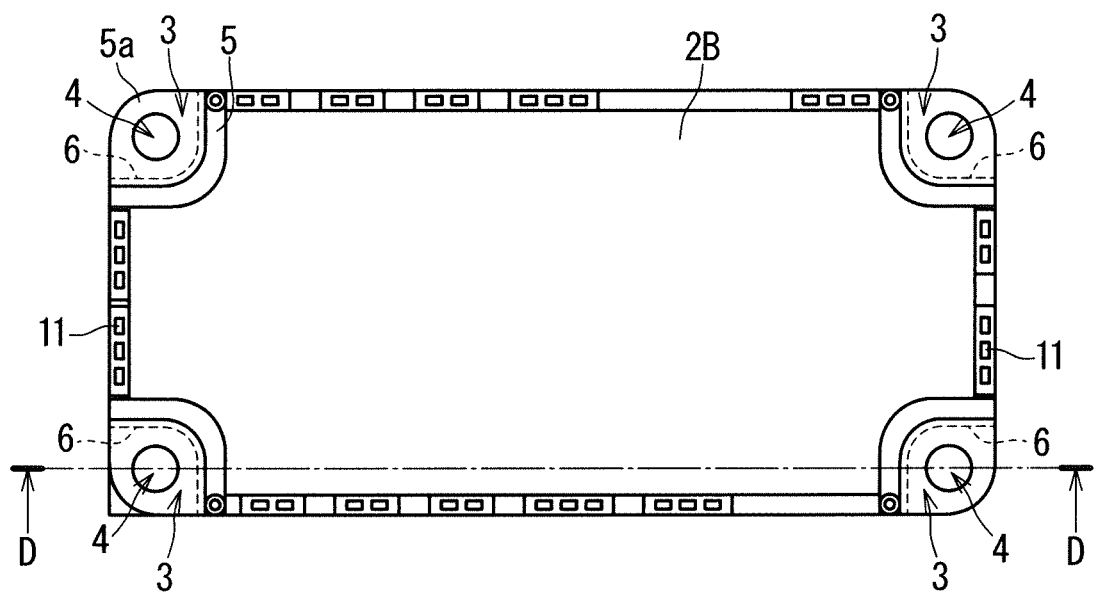
FIG. 10 is a plan view illustrating a state before a resin case and a base plate included in a semiconductor device according to Embodiment 3 are attached to a heat dissipation component.
Figure 11:
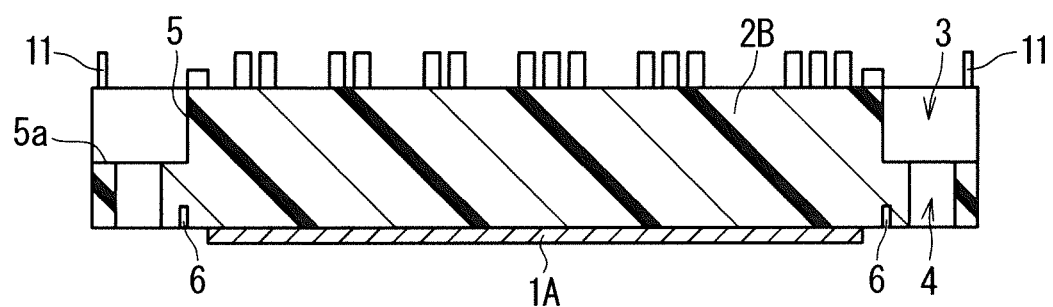
FIG. 11 is a cross-sectional view taken along line D-D of FIG. 10.
Figure 12:
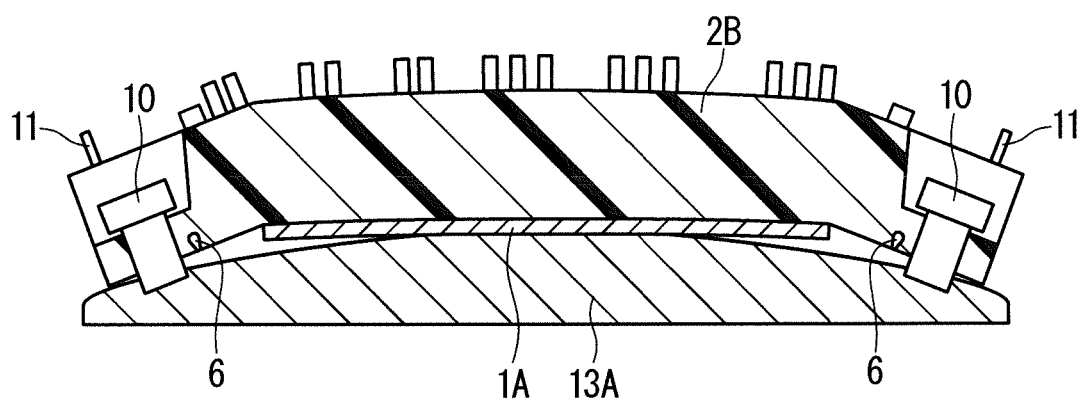
FIG. 12 is a cross-sectional view illustrating the semiconductor device according to Embodiment 3.
Figure 13A:
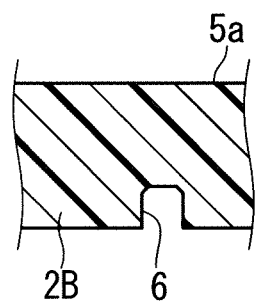
FIGS. 13A and 13B are enlarged cross-sectional views around a groove before and after bolt fastening.
Figure 13B:
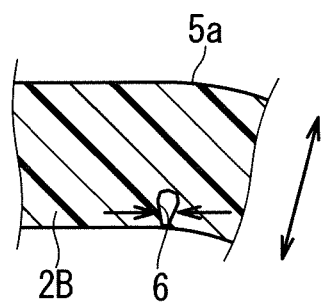

Next, a semiconductor device 100B according to Embodiment 3 will be described. FIG. 10 is a plan view illustrating a state before a resin case 2B and a base plate 1A included in the semiconductor device 100B are attached to a heat dissipation component 13A. FIG. 11 is a cross-sectional view taken along line D-D of FIG. 10. FIG. 12 is a cross-sectional view illustrating the semiconductor device 100B. FIG. 13A is an enlarged cross-sectional view around a groove 6 before a bolt 10 is fastened. FIG. 13B is an enlarged cross-sectional view around the groove 6 after the bolt 10 is fastened. It should be noted that, in Embodiment 3, the same components as those described in Embodiments 1 and 2 are denoted by the same reference numerals, and the description thereof is omitted.

As illustrated in FIGS. 10 to 12, Embodiment 3 is different from Embodiment 2 in the position where the groove 6 is formed.

As illustrated in FIG. 13A, the groove 6 is a round groove that is recessed from the lower surface side to the upper surface side of the resin case 2B. As illustrated in FIGS. 12 and 13B, the groove 6 narrows and the corner of the resin case 2B is allowed to bend downward from the groove 6 as a starting point at the time of fixing the resin case 2B to heat dissipation component 13A with the bolts 10; therefore, fixing the resin case 2B along the shape of the upper surface of the heat dissipation component 13A is ensured As described above, in the semiconductor device 100B according to Embodiment 3, the heat dissipation component 13A has a shape in which the upper surface thereof is bulging in an arc shape, the groove 6 is a round groove that is recessed from the lower surface side to the upper surface side of the resin case 2B, the corners of the resin case 2B project from the base plate 1A toward the outer peripheral side, and, in a state where the grooves 6 are narrowed, the corners of the resin case 2B are bent downward.

Accordingly, the base plate 1A is not disposed on the back side of the corners of the resin case 2B; therefore, the corners of the resin case 2B is facilitated to bend downward at the time of fixing the resin case 2B to the heat dissipation component 13A with the bolts 10; therefore, the stress to be applied around the attachment holes 4 of the resin case 2B can be further relaxed. At this point, the groove 6 narrows and the corner of the resin case 2B is allowed to bend downward, and fixing the resin case 2B along the shape of the upper surface of the heat dissipation component 13A is ensured. Further, as illustrated in FIG. 13B, the groove 6 is narrowed after the bolt 10 is fastened; therefore, the corner of the resin case 2B is prevented from bending further downward.

Embodiment 4

Figure 14:
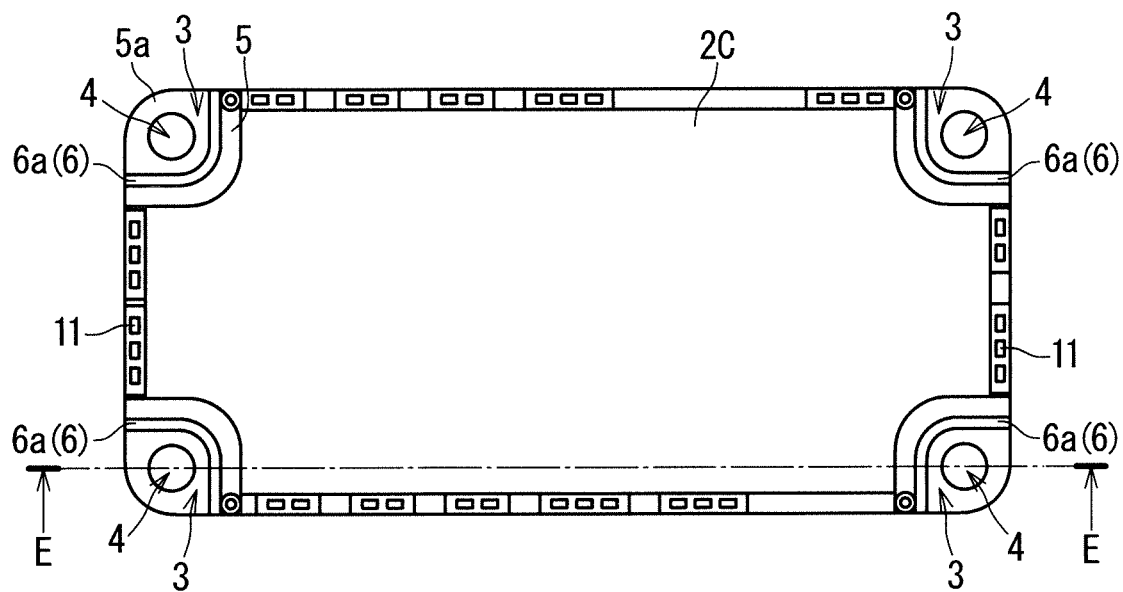
FIG. 14 is a plan view illustrating a state before a resin case and a base plate included in a semiconductor device according to Embodiment 4 are attached to a heat dissipation component.
Figure 15:
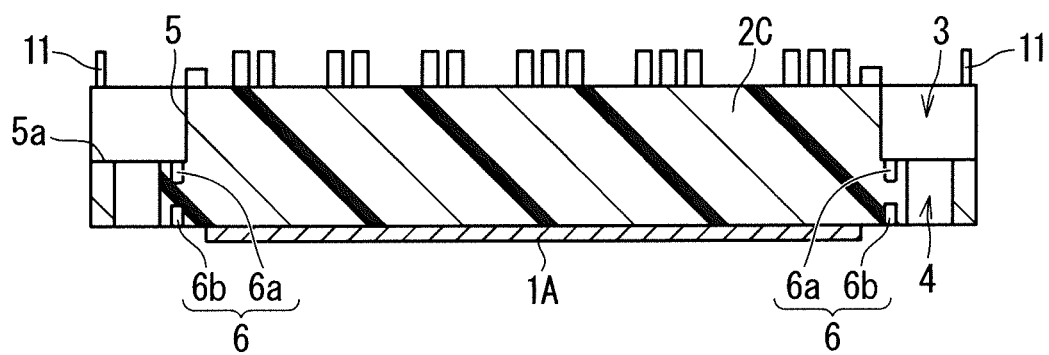
FIG. 15 is a cross-sectional view taken along line E-E of FIG. 14.

Next, a semiconductor device according to Embodiment 4 will be described. FIG. 14 is a plan view illustrating a state before a resin case 2C and a base plate 1A included in the semiconductor device according to Embodiment 4 are attached to a heat dissipation component 13A. FIG. 15 is a cross-sectional view taken along line E-E of FIG. 14. It should be noted that, in Embodiment 4, the same components as those described in Embodiments 1 to 3 are denoted by the same reference numerals, and the description thereof is omitted.

As illustrated in FIGS. 14 and 15, in Embodiment 4, the groove 6 is constructed with an upper groove 6a and a lower groove 6b, and the upper groove 6a and the lower groove 6b are formed on the upper surface side and the lower surface side of the resin case 2C, respectively. Specifically, the upper groove 6a is a round groove recessed from the upper surface side to the lower surface side of the resin case 2C as in the case of Embodiment 2. And, the lower groove 6b is a round groove recessed from the lower surface side to the upper surface side of the resin case 2C as in the case of Embodiment 3.

As in the case of Embodiments 2 and 3, consider a case where the resin case 2C is fixed to the heat dissipation component 13A with the bolts 10. At this point, the upper grooves 6a broaden and the lower grooves 6b narrow and the corners of the resin case 2C are allowed to bend downward from the upper grooves 6a and the lower grooves 6b as a starting point; therefore, fixing the resin case 2C along the shape of the upper surface of the heat dissipation component 13A is ensured.

The positions of the upper groove 6a and the lower groove 6b in the lateral direction may or may not be aligned. When the position of the upper groove 6a is aligned with the position of the lower groove 6b in the lateral direction, the corner of the resin case 2C is further facilitated to bend.

As described above, in the semiconductor device according to Embodiment 4, the heat dissipation component 13A has a shape in which the upper surface is bulging in an arc shape, the upper groove 6a is a round groove recessed from the upper surface side to the lower surface side of the resin case 2C, the lower groove 6b is a round groove recessed from the lower surface side to the upper surface side of the resin case 2C, and the corners of the resin case 2C project from the base plate toward the outer peripheral side, and, in a state, as the upper groove 6a that is recessed from the upper surface side to the lower surface side of the resin case 2C broadens and the lower groove 6b that is recessed from the lower surface side to the upper surface side narrows, the corner of the resin case 2C is bent downward.

Accordingly, the base plate 1A is not disposed on the back side of the corners of the resin case 2C; therefore, the corners of the resin case 2C is facilitated to bend downward at the time of fixing the resin case 2C to the heat dissipation component 13A with the bolts 10; therefore, the stress to be applied around the attachment holes 4 of the resin case 2C can be further relaxed. At this point, the upper grooves 6a broaden and the lower grooves 6b narrow and the corners of the resin case 2C is allowed to bend downward; therefore, the amount of bending of the corners of the resin case 2C can be adjusted. As a result, the fixing of the resin case 2C along the shape of the upper surface of the heat dissipation component regardless of the shape of the heat dissipation component is ensured.

Other Modification

Although the grooves 6 are preferably formed around the attachment holes 4 formed at the four corners of the resin case, the grooves 6 may formed around some of the attachment holes 4. For example, in a state where a heat dissipation component having a shape in which the upper surface is bulging in an arc shape, such as a heat dissipation component 13A, is attached, even when the grooves 6 are provided around the attachment hole 4 on one side of the resin case in plan view, and no groove 6 is provided around the attachment holes 4 on the opposite side, the same effect as each Embodiment can be obtained.

If the resin case does not need to be bent too much, for example, if the heat dissipation component 13A has a relatively small degree of bulging, by providing the groove 6 only around the at least one attachment hole 4, the same effect as each Embodiment can be obtained.

Further, also in Embodiments 2 to 4, two grooves 6 may be formed for each attachment hole. This makes the corners of the resin case be further facilitated to bend compare with the case where one groove is formed for each attachment hole. As a result, the stress applied around the attachment holes 4 of the resin case is further relaxed.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a base plate;
a heat dissipation component disposed on a lower surface of the base plate; and
a resin case being rectangular in plan view disposed on an upper surface of the base plate and accommodating a semiconductor element, wherein,
in a state where the resin case is disposed on the heat dissipation component via the base plate, the resin case is attached to the heat dissipation component with a bolt,
the resin case has a recess portion at a corner thereof in which a head of the bolt is placed, an attachment hole extending from a bottom surface of the recess portion and into which a shaft portion of the bolt is inserted, and at least one groove extending from the bottom surface in a direction towards the heat dissipation component and positioned between a side of the recess portion and the attachment hole, and
one end of the at least one groove reaches an outer peripheral end of the resin case, wherein
the contours of the base plate, the resin case, and the heat dissipation component are the same in the plan view.
2. The semiconductor device according to claim 1, wherein
the at least one groove including two grooves are formed on at least one surface side of the resin case.

* * * * *